United States Patent
Yamaha et al.

[11] Patent Number: 5,904,576
[45] Date of Patent: *May 18, 1999

[54] METHOD OF FORMING WIRING STRUCTURE

[75] Inventors: Takahisa Yamaha, Hamamatsu; Yushi Inoue, Hamatasu, both of Japan

[73] Assignee: Yamaha Corporation, Japan

[*] Notice: This patent is subject to a terminal disclaimer.

[21] Appl. No.: 08/961,276

[22] Filed: Oct. 30, 1997

[30]      Foreign Application Priority Data

Nov. 1, 1996  [JP]  Japan ................................. 8-306975

[51] Int. Cl.$^6$ .................................................. H01L 21/31
[52] U.S. Cl. .......................... 438/788; 438/788; 438/787; 438/629; 438/763; 257/634; 257/635
[58] Field of Search .................................... 438/788, 789, 438/781–782, 761–763, 787, 629; 257/634, 635, 642, 644

[56]             References Cited

U.S. PATENT DOCUMENTS

| | | | |
|---|---|---|---|
| 4,756,977 | 7/1988 | Haluska et al. | 428/704 |
| 5,059,448 | 10/1991 | Chandra et al. | 427/53.1 |
| 5,085,893 | 2/1992 | Weiss et al. | 427/387 |
| 5,118,530 | 6/1992 | Hanneman et al. | 427/226 |
| 5,145,723 | 9/1992 | Ballance et al. | 427/397.7 |
| 5,336,532 | 8/1994 | Haluska et al. | 427/515 |
| 5,369,795 | 11/1994 | Yanagimoto | 455/327 |
| 5,370,904 | 12/1994 | Mine et al. | 427/126.2 |
| 5,380,567 | 1/1995 | Haluska | 427/578 |
| 5,399,441 | 3/1995 | Bearinger et al. | 428/689 |
| 5,458,912 | 10/1995 | Camiletti et al. | 427/126.4 |
| 5,506,177 | 4/1996 | Kishimoto et al. | 437/195 |
| 5,548,159 | 8/1996 | Jeng | 257/634 |
| 5,567,661 | 10/1996 | Nishio et al. | 438/631 |
| 5,607,773 | 3/1997 | Ahlburn et al. | 428/427 |
| 5,683,940 | 11/1997 | Yahiro | 438/763 |
| 5,728,630 | 3/1998 | Nishimura et al. | 438/763 |
| 5,750,403 | 5/1998 | Inoue et al. | 438/787 |

FOREIGN PATENT DOCUMENTS

| | | |
|---|---|---|
| 629042 | 12/1994 | European Pat. Off. . |
| 647021 | 4/1995 | European Pat. Off. . |
| 6-181203 | 6/1994 | Japan . |
| 6-181204 | 6/1994 | Japan . |

OTHER PUBLICATIONS

Wolf et al., Silicon Process for the VLSI Era, vol. 2, pp. 273–276, 1990.

*Patent Abstracts Of Japan*, vol. 17, No. 032(E–1309), Jan. 21, 1993 & JP 4–253309, Sep. 9, 1992.

*Patent Abstracts Of Japan*, vol. 17, No. 075 (E–1320), Feb. 15, 1993 & JP 4–277910, Oct. 2, 1992.

*Patent Abstracts Of Japan*, vol. 10, No. 283 (E–440), Sep. 26, 1986 & JP 61–101109, May 20, 1986.

B. T. Ahlburn, et al., "A Non–Etch Back Spin on Glass for 0.5μM Devices Using Hydrogen Silsesquioxane As A Replacement For Methylsiloxane", Jun. 7–8, 1994, VMIC Conference, 1994 ISMIC, pp. 120–122.

(List continued on next page.)

*Primary Examiner*—Charles Bowers
*Assistant Examiner*—Thanh Nguyen
*Attorney, Agent, or Firm*—Ostrolenk, Faber, Gerb & Soffen, LLP

[57]                ABSTRACT

After wiring patterns are formed on an insulating film covering the surface of a substrate, an insulating film such as plasma CVD $SiO_2$ is formed covering the wiring patterns. A hydrogen silsesquioxane resin film with a flat surface is formed by spin coating or the like on the insulating film. Thereafter, the resin film is changed into a pre-ceramic silicon oxide film by performing heat treatment in an inert gas atmosphere. On this pre-ceramic silicon oxide film, an insulating film such as plasma enhanced CVD $SiO_2$ film is formed and another wiring layer is formed on the insulating film. This method of forming a multi-layer wiring structure allows an interlayer insulating film to be planarized, and improves a yield of wiring formation.

28 Claims, 7 Drawing Sheets

OTHER PUBLICATIONS

B.T. Ahlburn, et al., "Hydrogen Silsesquioxane–Based Flowable Oxide as an Element in the Interlevel Dielectric for Sub 0.5 Micron ULSI Circuits", Feb. 21–22, 1995, VMIC Conference, 1995 ISMIC, pp. 36–42.

D.S. Ballance, et al., "Low Temperature Reflow Planarization Using A Novel Spin–On Interlevel Dielectric", Jun. 9–10, 1992, VMIC Conference, 1992 ISMIC, pp. 180–186.

D. Pramanik, et al., "Reliability of Multilevel Circuits Using Hydrogen Silsesquioxane FOx for Interlevel Dielectric Planarization", Jun. 8–9, 1993, VMIC Conference, 1993 ISMIC, pp. 329–331.

Brochure, "Application Notes for Dow Corning Flowable Oxide", 1993, Dow Corning Corporation, pp. 1–4.

R. Dawson, et al., "Performance of Logic Devices Utilizing A Novel Spin–On Dielectric Planarization Process", Jun. 8–9, 1993, VMIC Conference, 1993 ISMIC, p. 218.

though the conditions of forming a ceramic silicon oxide film with heat treatment in an $O_2$ atmosphere are not the same.

METHOD OF FORMING WIRING STRUCTURE

This application is based on Japanese Patent Application No. 8-306975 filed on Nov. 1, 1996, the entire contents of which are incorporated herein by reference.

BACKGROUND OF THE INVENTION a) Field of the Invention

The present invention relates to a method of forming a wiring structure suitable for the manufacture of LSIs or the like, and a resultant wiring structure. More particularly, the invention relates to a method of forming a wiring structure and a resultant wiring structure, in which an interlayer insulating film is formed by using a hydrogen silsesquioxane resin film.

b) Description of the Related Art

Forming an interlayer insulating film in a multi-layer wiring structure by a hydrogen silsesquioxane resin film is already known (for example, refer to Japanese Patent Laid-open Publication No. 6-181204).

With such an interlayer insulating film forming method, a hydrogen silsesquioxane resin film is coated over the surface of a high quality CVD oxide film on a semiconductor substrate by spin coating or the like, and thereafter the resin film is thermally processed in an inert gas atmosphere such as $N_2$ to change the resin film into a pre-ceramic silicon oxide film. The pre-ceramic silicon oxide film is again thermally processed in an oxidizing atmosphere such as $O_2$ to change the pre-ceramic silicon oxide film into a ceramic silicon oxide film. Pre-ceramic silicon oxide is a precursor of ceramic silicon oxide and has less bridging network than in ceramic silicon oxide and is insoluble to organic solvent.

This method can form a silicon oxide film of 1 μm thick or more without any crack. Such a silicon oxide film becomes a useful interlayer insulating film.

SUMMARY OF THE INVENTION

It is an object of the present invention to provide a novel method of forming a wiring structure, capable of improving a yield of wiring pattern formation. It is another object of the invention to provide a novel wiring structure.

According to one aspect of the present invention, there is provided a method of fabricating a wiring comprising the steps of: a) providing a substrate having an overlying structure thereon; b) forming a hydrogen silsesquioxane resin film over the substrate; c) subjecting said hydrogen silsesquioxane resin film to a heat treatment in an inert gas atmosphere to convert said hydrogen silsesquioxane resin film into a silicon oxide film of a preceramic phase; and d) forming an interlayer insulating film and a wiring structure over the silicon oxide film of the preceramic phase.

According to another aspect of the present invention, there is provided a method of forming a multi-layer wiring structure comprising the steps of: forming a first wiring layer on a first insulating film covering a substrate; forming a hydrogen silsesquioxane resin film with a flat surface which resin film covers the first insulating film and the first wiring layer; changing the hydrogen silsesquioxane resin film into a pre-ceramic silicon oxide film by performing heat treatment on the hydrogen silsesquioxane resin film in an inert gas atmosphere; forming a second insulating film covering the pre-ceramic silicon oxide film; and forming a second wiring layer on the second insulating film.

With this method, the generation of fine bulges on the surface can be prevented because heat treatment for changing a pre-ceramic silicon oxide film into a ceramic silicon oxide film is not performed.

Since the generation of fine bulges can be prevented by not performing heat treatment for changing a pre-ceramic silicon oxide film into a ceramic silicon oxide film, it is possible to prevent the shape of a contact hole in an interlayer insulating film from being deformed, to planarize the interlayer insulating film, and to improve a yield of wiring formation.

Furthermore, since ceramic forming heat treatment is not necessary, the wiring formation processes can be simplified.

DETAILED DESCRIPTION OF THE PREFERRED EMBODIMENTS

According to the studies made by the present inventors, fine bulges having a diameter of about 0.1 μm are formed on the surface of a ceramic silicon oxide film formed by the above-described conventional method. This method is therefore associated with some problem of lowering a yield of wiring formation.

FIGS. 8 to 12 illustrate studies of the present inventors on a conventional method of forming a multi-layer wiring structure utilizing conventional techniques. Problems of this method will be described in the following.

Figure 1:
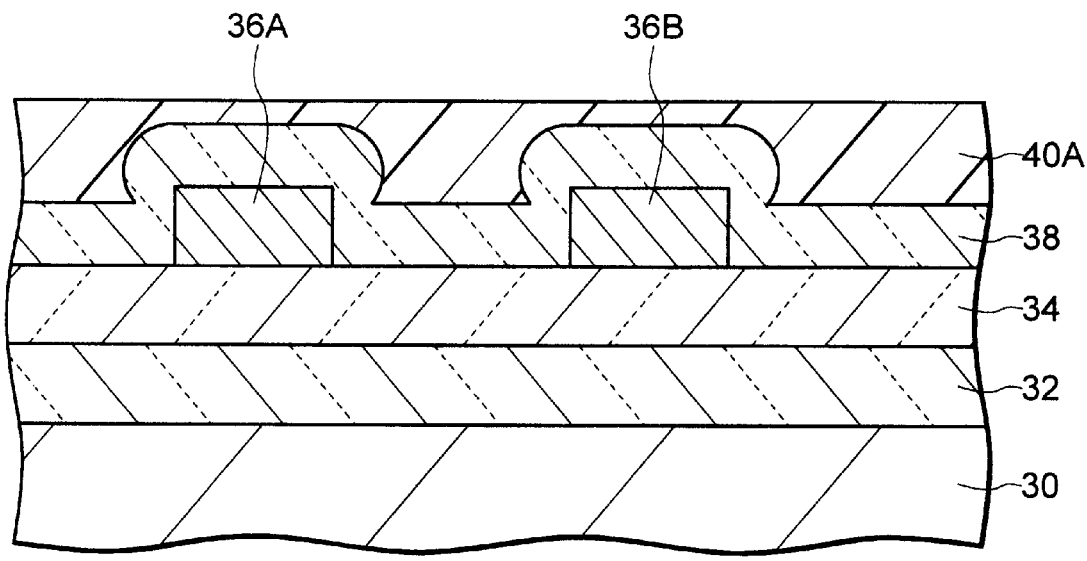
FIG. 1 is a cross sectional view of a substrate illustrating a resin film forming process of a method of forming a multi-layer wiring structure according to an embodiment of the invention.
Figure 2:
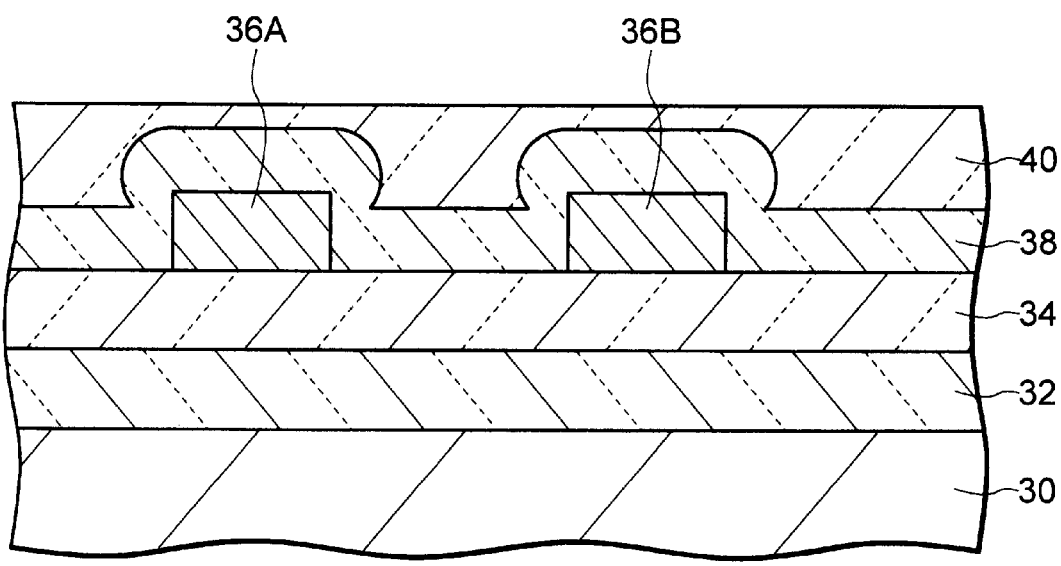
FIG. 2 is a cross sectional view of the substrate illustrating a pre-ceramic forming process after the process shown in FIG. 1.
Figure 3:
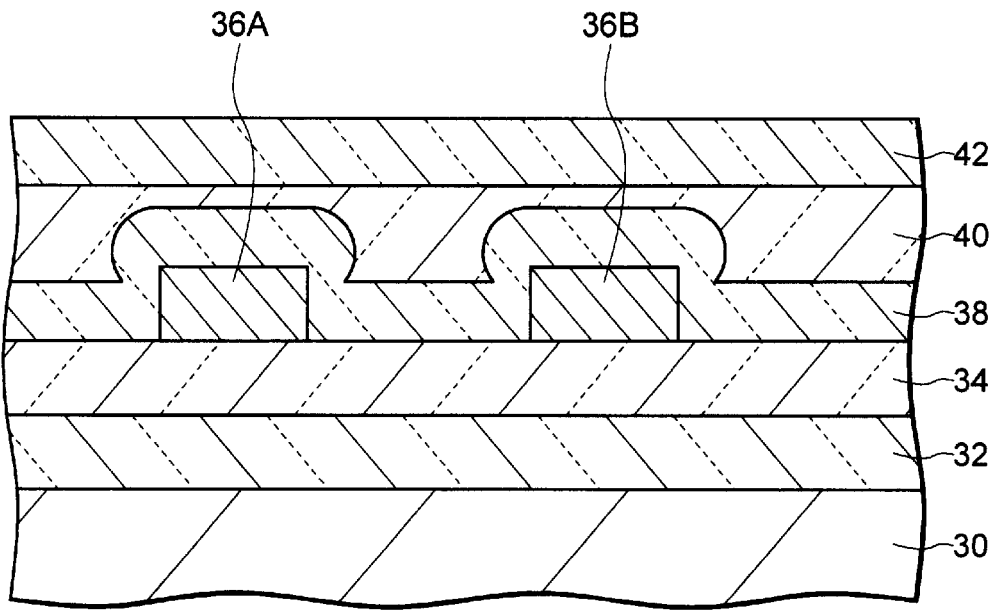
FIG. 3 is a cross sectional view of the substrate illustrating an insulating film forming process after the process shown in FIG. 2.
Figure 4:
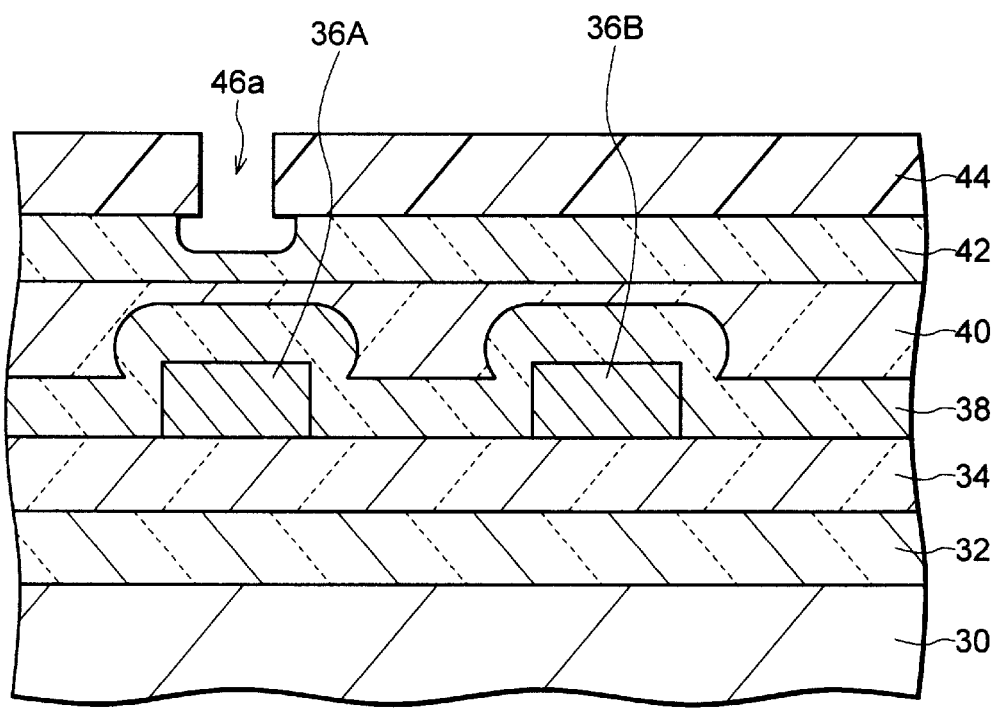
FIG. 4 is a cross sectional view of the substrate illustrating a wet etching process after the process shown in FIG. 3.
Figure 5:
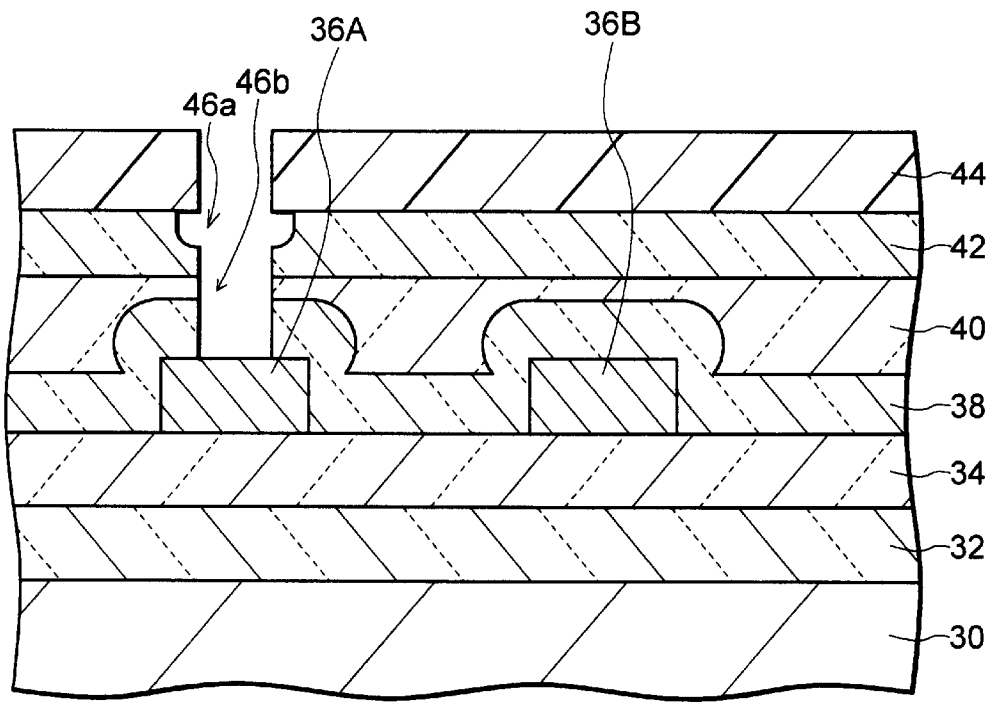
FIG. 5 is a cross sectional view of the substrate illustrating a dry etching process after the process shown in FIG. 4.
Figure 6:
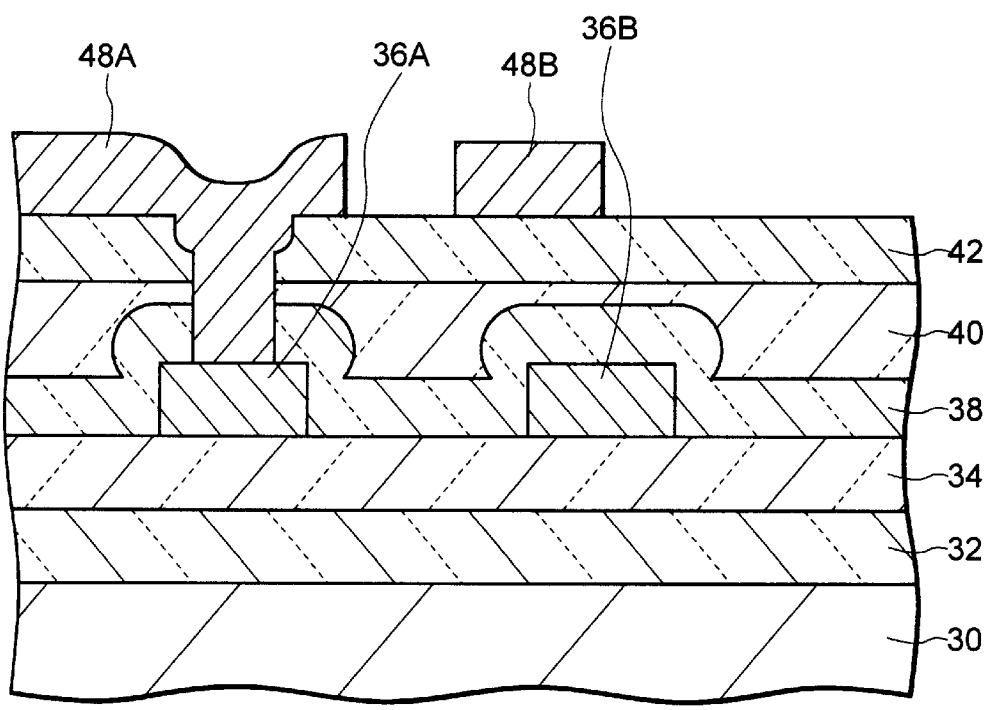
FIG. 6 is a cross sectional view of the substrate illustrating a wiring layer forming process after the process shown in FIG. 5.
Figure 7:
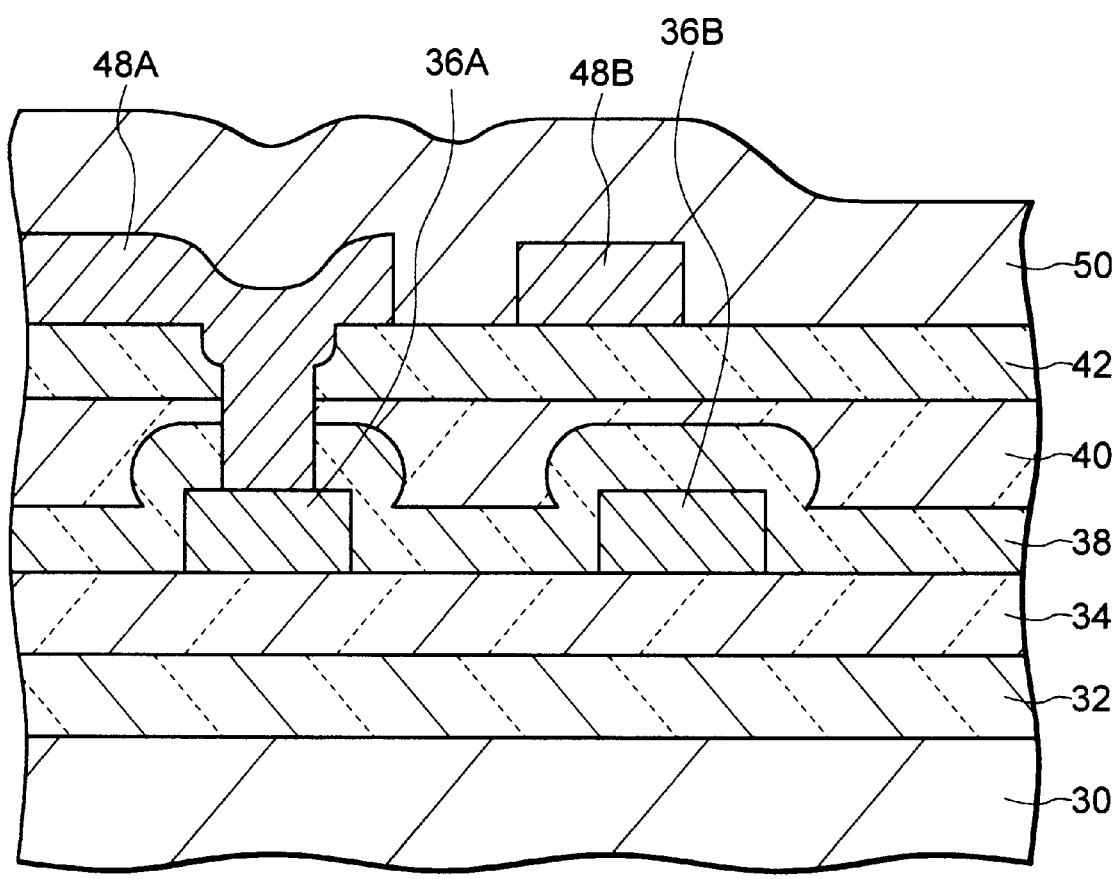
FIG. 7 is a cross sectional view of the substrate illustrating a passivation film forming process after the process shown in FIG. 6.
Figure 8:
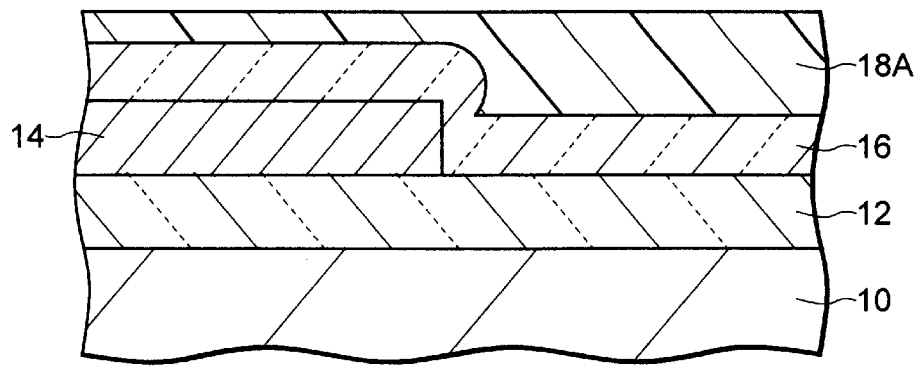
FIG. 8 is a cross sectional view of a substrate illustrating studies of the present inventors on a resin film forming process of a conventional method of forming a multi-layer wiring structure.

In the process shown in FIG. 8, a wiring layer 14 is formed on an insulating film 12 such as silicon oxide covering the surface of a semiconductor substrate 10. Thereafter, an insulating film 16 made of silicon oxide is formed by plasma enhanced chemical vapor deposition (CVD), the insulating film 16 covering the insulating film 12 and wiring layer 14. Solution of hydrogen silsesquioxane resin $(HSiO_{3/2})_n$ dissolved with MIBK (methyl-isobutyl-ketone) is spin-coated over the substrate surface to form, on the insulating film 16, a hydrogen silsesquioxane resin film 18A having a flat surface.

Figure 9:
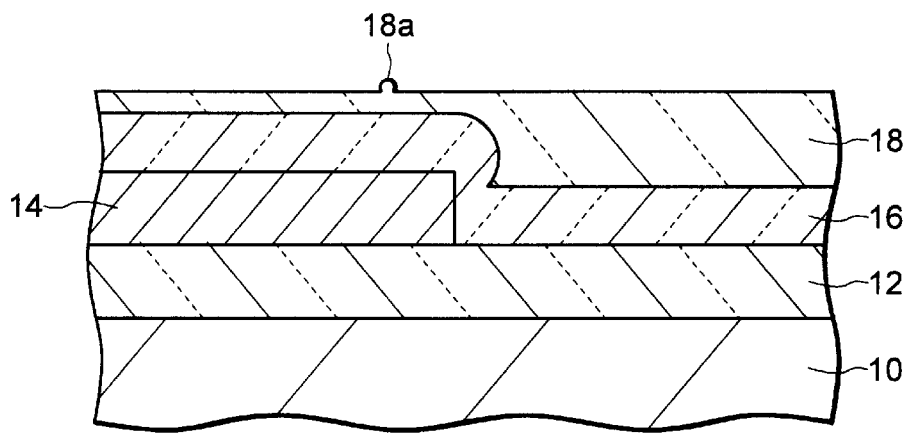
FIG. 9 is a cross sectional view of the substrate illustrating studies of the present inventors on a pre-ceramic forming process and a ceramic forming process after the process shown in FIG. 8.

In the process shown in FIG. 9, the substrate is subjected to heat treatment in an inert gas atmosphere to change the resin film 18A into a pre-ceramic silicon oxide film 18. The substrate is again subjected to heat treatment in an atmosphere of mixed gas of $O_2$ gas and inert gas to change the pre-ceramic silicon oxide film 19 into a ceramic silicon oxide film 18. In this case, a fine bulge 18a having a diameter of about 0.1 μm is formed on the surface of the ceramic silicon oxide film 18.

Figure 10:
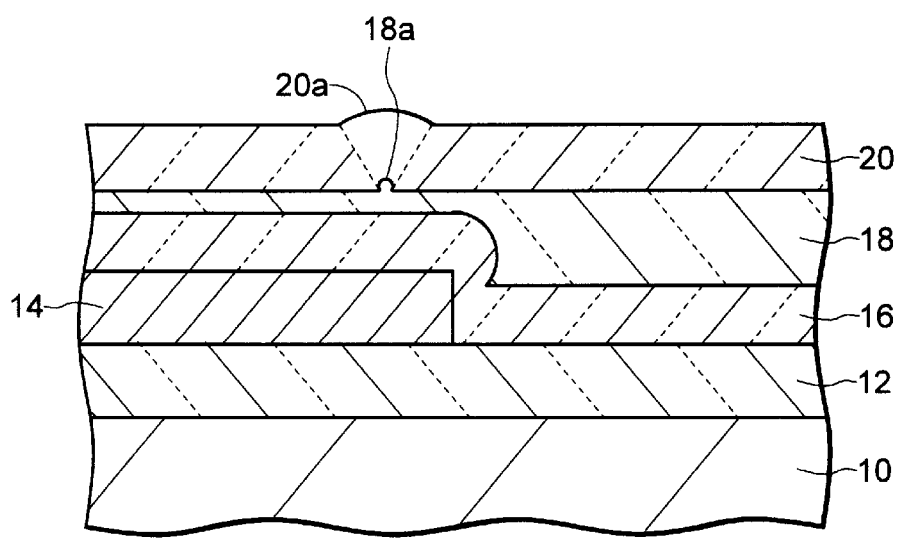
FIG. 10 is a cross sectional view of the substrate illustrating studies of the present inventors on an insulating film forming process after the process shown in FIG. 9.

In the process shown in FIG. 10, an insulating film 20 of silicon oxide is formed by plasma enhanced CVD on the surface of the ceramic silicon oxide film 18. In this case, a protrusion 20a is formed on the surface of the insulating film 20, accurately reflecting the topology of the fine bulge 18a on the ceramic silicon oxide film 18.

Figure 11:
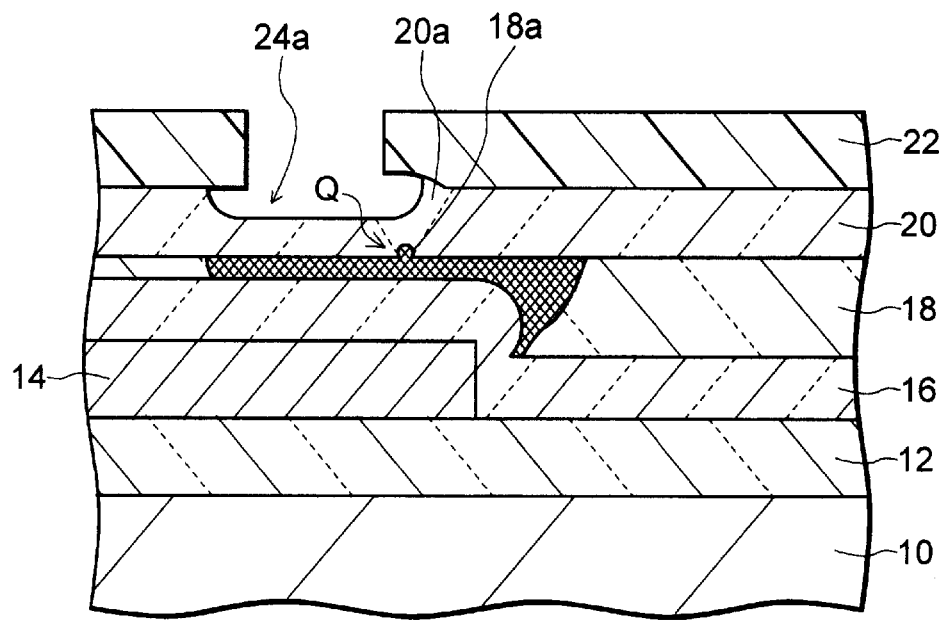
FIG. 11 is a cross sectional view of the substrate illustrating studies of the present inventors on a wet etching process after the process shown in FIG. 10.
Figure 12:
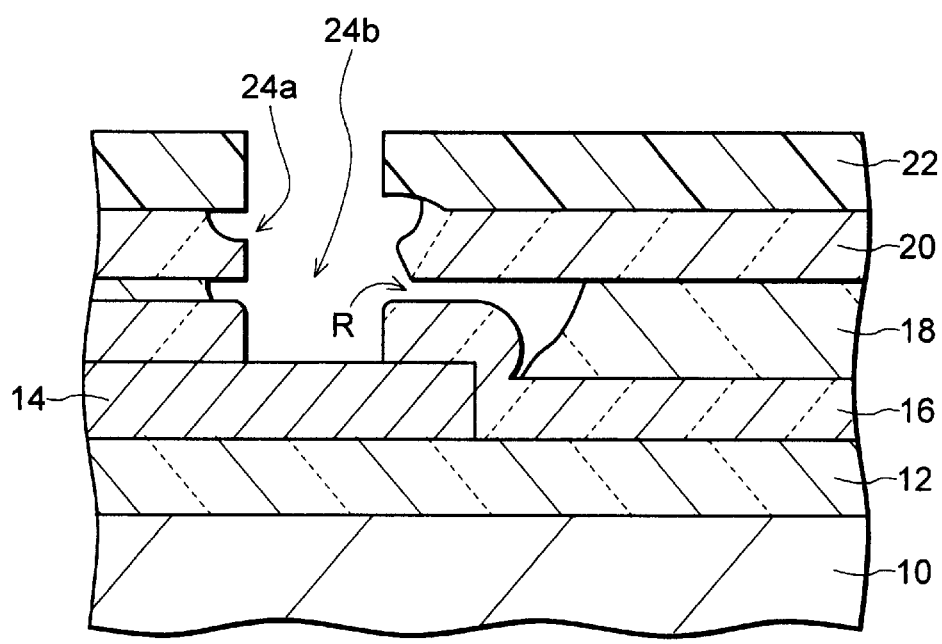
FIG. 12 is a cross sectional view of the substrate illustrating studies of the present inventors on a dry etching process after the process shown in FIG. 11.

One of problems caused by such fine bulge 18a and protrusion 20a is the deformation of a contact hole as shown in FIGS. 11 and 12.

In the process shown in FIG. 11, a resist layer 22 with an opening at an area corresponding to a contact hole is formed on the insulating film 20. By using the resist layer 22 as a mask, a shallow contact hole 24a is formed in the insulating film 20 by selective wet etching (isotropical etching). This shallow contact hole 24a is used for alleviating a step at the upper opening end of a deep contact hole 24b shown in FIG. 12 to thereby improve step coverage of a wiring pattern.

In the wet etching process in FIG. 11, if etchant used is a mixture of aqueous solution $NH_4F$ and HF of 10:1, the fine bulge 18a and nearby area Q (indicated by hatching) are impregnated and dissolved with this etchant via the protrusion 20a, because the film quality of the protrusion 20a is coarse.

In the next process shown in FIG. 12, selective dry etching using the resist layer 22 as a mask is performed to form the contact hole 24b extending from the contact hole 24a to the wiring layer 14. Since the fine bulge 18a and nearby area Q are etched and removed, a recess R is formed in the side wall of the contact hole 24b.

After the resist layer 22 is removed, wiring material is deposited over the substrate surface and patterned to form a wiring pattern (not shown) reaching the wiring layer 14 via the contact holes 24a and 24b. The wiring pattern formed by the above processes has poor step coverage at the recess R in the side wall of the contact hole 24, lowering its reliability.

Figure 13:
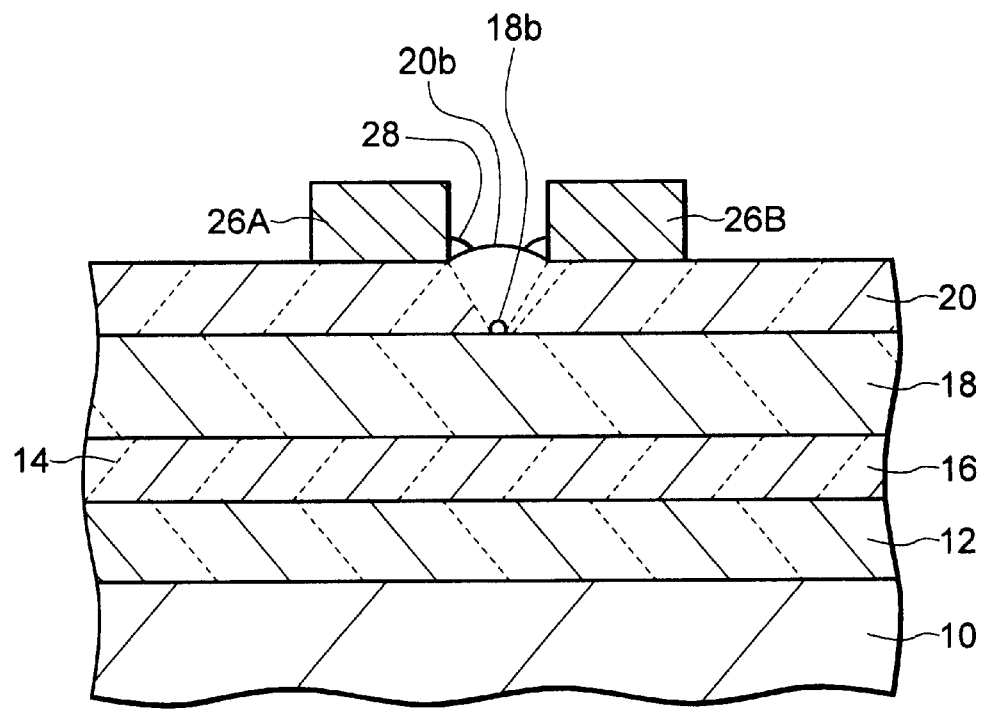
FIG. 13 is a cross sectional view of a substrate showing studies of the present inventors on the state of a wiring layer formed near a bulge on an interlayer insulating film.
Figure 14:
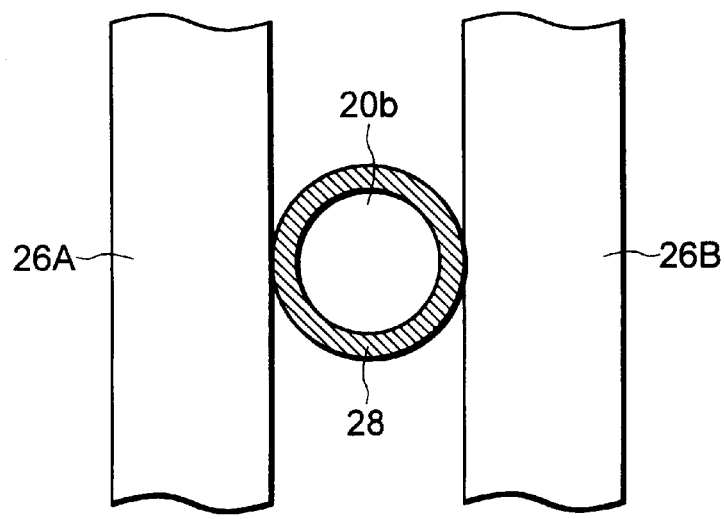
FIG. 14 is a plan view of the wiring structure shown in FIG. 13.

Another problem to be caused by the fine bulge and protrusion is a short circuit between wiring layers near a protrusion 20b corresponding to a fine bulge 18b shown in FIGS. 13 and 14. These fine bulge 18b and protrusion 20b are formed in the manner similar to the already described fine bulge 18a and protrusion 20a.

After the process shown in FIG. 10, wiring material is deposited over the substrate surface and patterned through selective etching to form a wiring pattern. In this case, as shown in FIGS. 13 and 14, if wiring patterns 26A and 26B are formed interposing therebetween the protrusion 20b, a portion of the wiring material is left as a residual portion 28 which surrounds the protrusion 20b. As seen from FIG. 14, this residual portion 28 electrically shorts the wiring patterns 26A and 26B.

FIGS. 1 to 7 illustrate processes of a method of forming a multi-layer wiring structure according to an embodiment of the invention. Processes (1) to (7) of the method of forming the multi-layer wiring structure will be described with reference to corresponding FIGS. 1 to 7 sequentially in this order.

(1) An insulating film 34 made of borophosphosilicate glass (BPSG) is deposited 750 nm thick by normal pressure (1 atm) CVD or the like on the surface of an insulating film 32 made of, for example, silicon oxide and covering the surface of a semiconductor substrate 30 made of, for example, silicon. A lamp anneal process is performed to make the insulating film 34 dense. Circuit elements such as MOS transistors are prefabricated on the semiconductor substrate 30 made of a p type silicon or the like. For the general knowledge regarding this, reference may be made to U.S. patent application S.N. 08/852,095 filed on May 6, 1997, which is incorporated herein by reference.

The conditions of forming the insulating film 34 of BPSG are illustratively given in the following.

Substrate temperature: 400° C. Source gas: $SiH_4$ (46.25 sccm)+$PH_3$ (8.75 sccm)+$B_2H_6$ (7.5 sccm)+$O_2$ (7000 sccm)+$N_2$ (50000 sccm)

The conditions of the lamp annealing process are illustratively given in the following.

Substrate temperature: 850° C.

Temperature rise time to 850° C.: 10 seconds

Temperature holding time at 850° C.: 10 seconds

Next, wiring materials are deposited over the substrate surface by sputtering or the like. The deposited layer is patterned through selective dry etching using a resist mask to form wiring patterns 36A and 36B. The sputtered wiring material layers are, for example, a Ti layer (20 nm), a TiON layer (100 nm), an Al-Si-Cu alloy layer (400 nm) and a TiN layer (40 nm) in this order from the bottom. The conditions of the dry etching process are illustratively given in the following.

Etching gas: $Cl_2$ (30 sccm)+$BCl_3$ (30 sccm)

Etching chamber pressure: 10 mTorr.

Next, an insulating film 38 of silicon oxide ($SiO_2$) is deposited 300 nm thick by plasma CVD on the insulating film 34, the insulating film 38 covering the wiring patterns 36A and 36B. The conditions of forming the insulating film 38 are illustratively given in the following.

Substrate temperature: 400° C.

Source gas: $SiH_4$ (240 sccm)+$N_2O$ (5000 sccm)+$N_2$ (2800 sccm)

Reaction chamber pressure: 2.2 Torr

Next, a hydrogen silsesquioxane resin film 40A with a flat surface is formed covering the insulating film 38. For example, the resin film 40A was formed by coating solution of hydrogen silsesquioxane resin dissolved with MIBK to a thickness of 500 nm by using a spin coater. The thickness of the resin film 40A may be set to a desired value in the range from 300 nm to 600 nm.

(2) The resin film 40A is subjected to heat treatment in an inert gas atmosphere to change the resin film 40A into a pre-ceramic silicon oxide film 40. For example, the heat treatment is performed for 1 to 60 minutes at a temperature in the range from 150° C. inclusive to 350° C. exclusive by using $N_2$ gas as the inert gas. This heat treatment was performed, for example, by hot plate baking for 1 minute at 150° C.+for 1 minute at 200° C.+for 1 minute at 300° C. in an $N_2$ gas atmosphere.

The temperature of the pre-ceramic forming heat treatment is 400° C. or lower. In general, after the pre-ceramic formation process, a ceramic formation heat treatment is performed at a temperature of 700° C. or higher in an oxidizing atmosphere. The temperature of the pre-ceramic forming heat treatment is preferably set to 300° C. or lower in order to reliably prevent the generation of fine bulges while maintaining fluidity of hydrogen silsesquioxane resin. In this embodiment, only the pre-ceramic forming process is performed and the ceramic forming process is not performed.

(3) An insulating film 42 of silicon oxide ($SiO_2$) is deposited 500 nm thick by plasma enhanced CVD, covering the pre-ceramic silicon oxide film 40. The conditions of forming the insulating film 42 are illustratively given in the following.

Substrate temperature: 400° C.

Source gas: $SiH_4$ (240 sccm)+$N_2O$ (5000 sccm)+$N_2$ (2800 sccm)

Reaction chamber pressure: 2.2 Torr

A silicon oxide film formed by the following method (A) or (B) may be used as the insulating film 42.

(A) Plasma enhanced CVD using tetra ethyl ortho silicate (TEOS) $Si(OC_2H_5)_4$ and $O_2$ as source materials. The film forming conditions are illustratively given in the following.

Substrate temperature: 400° C.

Source gas: TEOS (1.8 cc/min supplied in the liquid phase)+$O_2$ (8000 sccm)

Reaction chamber pressure: 2.2 Torr (B) Sputtering using $SiO_2$ as a target: The film forming conditions are illustratively given in the following.

Sputtering system: RF sputtering system (13.56 MHz)

Substrate temperature: 200° C.

Target: $SiO_2$

Reaction chamber atmosphere: mixed gas of argon and oxygen

RF power: 1 kW

In both the methods (A) and (B), the substrate temperature is set to 400° C. or lower. Under the above conditions, the pre-ceramic silicon oxide film 40 is not changed into a ceramic oxide film but it maintains a pre-ceramic state.

(4) A resist layer 44 with an opening at an area corresponding a contact hole is formed on the insulating film 42 by know photolithography techniques. Thereafter, by using the resist layer 44 as a mask, selective wet etching (isotropic etching) is performed to form a shallow contact hole 46a in the insulating film 42, the contact hole 46a having a diameter larger than the opening of the resist layer 44. The contact hole 46a is used for alleviating a step at the upper opening end of a deep contact hole 46b shown in FIG. 5 to thereby improve step coverage of a wiring pattern.

In the wet etching process, a mixture of aqueous solution $NH_4F$ and HF of 10:1 was used as etchant. The processes up to that shown in FIG. 3 do not form any fine bulge on the silicon oxide film 40 and a protrusion reflecting the fine bulge on the insulating film 42. Therefore, a portion of the silicon oxide film 40 was not dissolved with etchant, as opposed to the conventional techniques.

(5) Selective dry etching (anisotropic etching) using the resist layer 44 as a mask is performed to form the deep contact hole 46b extending from the contact hole 46a to the wiring pattern 36A. Since the silicon film 40 is not partially dissolved unnecessarily, the contact hole 46b having a normal shape can be formed without a recess R such as shown in FIG. 12.

(6) Wiring materials are deposited over the substrate surface by sputtering or the like, and the deposited layer is patterned through selective dry etching using a resist mask to form wiring patterns 48A and 48B. The wiring pattern 48A is connected via the contact holes 46a and 46b to the wiring layer 36A. For example, the wiring materials of Al-Si-Cu were deposited to a thickness of 400 nm by sputtering. The conditions of the dry etching process are illustratively given in the following.

Etching gas: $Cl_2$ (30 sccm)+$BCl_3$ (30 sccm)

Etching chamber pressure: 10 mTorr

Since both the contact holes have normal shapes, the wiring pattern 48A can be formed with a good step coverage. Even if the wiring patterns 48A and 48B are formed near each other, these patterns are not electrically shorted by residual wiring material because a protrusion corresponding to a fine bulge such as shown in FIGS. 13 and 14 is not formed.

(7) After the wiring patterns 48A and 48B are formed, the substrate 30 is placed in a vertical furnace to make the wiring structure of the substrate 30 undergo heat treatment for 30 minutes at 400° C. in a nitrogen atmosphere. Thereafter, a passivation film 50 of silicon nitride or the like is formed by plasma CVD on the insulating film, covering the wiring patterns 48A and 48B. The conditions of forming a silicon nitride film by plasma CVD are illustratively given in the following.

Substrate temperature: 400° C.

Source gas: $SiH_4$ (300 sccm)+$NH_3$ (1800 sccm)+$N_2$ (1000 sccm)

Reaction chamber pressure: 2.6 Torr

The heat treatment immediately before the passivation film 50 is formed uses the nitrogen atmosphere not containing oxygen, and the insulating film 42 covers the silicon oxide film 40 during this heat treatment and during the formation of the passivation film 50. Therefore, the pre-ceramic state of the silicon oxide film 40 is maintained unchanged even after the passivation film is formed.

In the embodiment described above, the pre-ceramic silicon oxide film 40 not changed into a ceramic state is partially used as an interlayer insulating film. Therefore, a flat interlayer insulating film without a fine bulge can be formed. The ceramic forming heat treatment is unnecessary so that the processes can be simplified.

Provision of the insulating film 38 is advantageous in that hillocks can be prevented from being formed on the wiring patterns 36A and 36B. In some cases, the insulating film 38 may be omitted and the hydrogen silsesquioxane resin film 40A may be formed directly covering the insulating film 34 and wiring patterns 36A and 36B.

Of the interlayer insulating films between the wiring patterns 36A and 36B and wiring patterns 48A and 48B, the highest level insulating film 42 is desired to satisfy the conditions of hardness to forming cracks, low moisture absorption, and easiness of forming the film at a low temperature. An insulating film formed by a method providing poor step coverage, such as plasma enhanced CVD and sputtering described above, can satisfy the above conditions and is suitable for use as the insulating film 42.

The present invention has been described in connection with the preferred embodiment. The invention is not limited only to the above embodiment. It will be apparent to those skilled in the art that various modifications, improvements, combinations, and the like can be made.

What is claimed is:

1. A method of fabricating a wiring comprising the steps of:
   a) providing a substrate having an overlying structure thereon;
   b) forming a hydrogen silsesquioxane resin film over the substrate;
   c) subjecting said hydrogen silsesquioxane resin film to a heat treatment in an inert gas atmosphere to convert said hydrogen silsesquioxane resin film into a silicon oxide film of a preceramic phase; and
   d) forming an interlayer insulating film and a wiring structure over the silicon oxide film of the preceramic phase.

2. A method according to claim 1, wherein the heat treatment is performed in a temperature range from 150° C. to 350° C.

3. A method according to claim 2, wherein the heat treatment is performed at a temperature of 300° C. or lower.

4. A method according to claim 3, wherein the inert gas atmosphere of the heat treatment is nitrogen gas.

5. A method according to claim 1, wherein said hydrogen silsesquioxane resin film has a thickness in a range from 300 nm to 600 nm after the heat treatment.

6. A method according to claim 1, further comprising the step of:
   e) forming a passivation film over the interlayer insulating film and the wiring.

7. A method according to claim 1, wherein in the step d), the interlayer insulating film is made by using one of a method of forming a phosphosilicate glass film or a borophosphosilicate glass film by atmospheric pressure chemical vapor deposition (CVD), a method of forming a silicon oxide film by plasma CVD using tetra ethyl ortho silicate as a silicon source material, and a method of forming an inorganic film by spin coating.

8. A method of fabricating a wiring comprising the steps of:
   a) providing a substrate;
   b) forming a first interlayer insulating film and a first level wiring over the substrate;
   c) forming a hydrogen silsesquioxane resin film over first interlayer insulating film and the first level wiring;
   d) subjecting said hydrogen silsesquioxane resin film to a heat treatment in an inert gas atmosphere to convert said hydrogen silsesquioxane resin film into a second interlayer insulating film of a preceramic phase;
   e) forming a third interlayer insulating film and a second level wiring over the silicon oxide film of the preceramic phase;
   f) forming a passivation film over the second interlayer insulating film and the second level wiring while the second interlayer insulating film is kept in the preceramic phase.

9. A method according to claim 8, wherein the heat treatment is performed in a temperature range from 150° C. to 350° C.

10. A method according to claim 9, wherein the heat treatment is performed at a temperature of 300° C. or lower.

11. A method according to claim 10, wherein the inert gas atmosphere of the heat treatment is nitrogen gas.

12. A method according to claim 8, wherein said hydrogen silsesquioxane resin film has a thickness in a range from 300 nm to 600 nm after the heat treatment.

13. A method according to claim 8, wherein in the step e) wherein the third interlayer insulating film is made by using one of a method of forming a phosphosilicate glass film or a borophosphosilicate glass film by atmospheric pressure chemical vapor deposition (CVD), a method of forming a silicon oxide film by plasma CVD using tetra ethyl ortho silicate as a silicon source material, and a method of forming an inorganic film by spin coating.

14. A method of forming a multi-layer wiring structure comprising the steps of:
   (a) forming a first wiring layer on a first insulating film covering a substrate;
   (b) forming a hydrogen silsesquioxane resin film with a flat surface directly covering the first insulating film and the first wiring layer;
   (c) changing the hydrogen silsesquioxane resin film into a pre-ceramic silicon oxide film by performing heat treatment in an inert gas atmosphere;
   (d) forming a second insulating film covering the pre-ceramic silicon oxide film;
   (e) forming a contact hole through the second insulating film and the pre-ceramic silicon oxide film to expose a partial surface area of the first wiring layer; and
   (f) forming a second wiring layer over the second insulating film.

15. A method according to claim 14, wherein said step (b) is performed by spin coating.

16. A method according to claim 15, wherein said step (b) is performed by using solution of hydrogen silsesquioxane resin dissolved with methyl-isobutyl-ketone.

17. A method according to claim 14, wherein said step (c) is performed at a temperature of 400° C. or lower.

18. A method according to claim 14, wherein said step (c) is performed at a temperature in the range from 150° C. to 350° C.

19. A method according to claim 14, wherein said step (c) is performed at a temperature in the range from 150° C. to 300° C.

20. A method according to claim 14, wherein said step (d) is performed at a temperature of 400° C. or lower.

21. A method according to claim 20, wherein the second insulating film consists essentially of silicon oxide.

22. A method according to claim 14, further comprising the step of:
   (g) depositing an underlying silicon oxide film covering the first Insulating film and the first wiring layer, before said step (b).

23. A method according to claim 22, wherein said step (g) is performed by plasma chemical vapor deposition.

24. A method according to claim 23, further comprising the step of:
   (h) annealing the underlying silicon oxide film at a temperature of 400° C. or lower, after said step (g).

25. A method according to claim 14, further comprising the step of:
   (i) depositing a passivation film covering the second wiring layer, after said step (f).

26. A method according to claim 25, wherein the passivation film is a silicon nitride film.

27. A method according to claim 14, wherein said step (e) includes wet etching followed by dry etching, using a resist mask with an opening.

28. A method according to claim 27, wherein the wet etching forms a contact hole through the second insulating film, the contact hole having a diameter larger than the opening of the resist mask.

* * * * *